(12) United States Patent
Shim

(10) Patent No.: US 6,965,532 B2
(45) Date of Patent: Nov. 15, 2005

(54) APPARATUS AND METHOD FOR CONTROLLING DATA OUTPUT OF A SEMICONDUCTOR MEMORY DEVICE

(75) Inventor: Young-Bo Shim, Ichon-shi (KR)

(73) Assignee: Hynix Semiconductor (KR)

( * ) Notice: Subject to any disclaimer, the term of this patent is extended or adjusted under 35 U.S.C. 154(b) by 0 days.

(21) Appl. No.: 10/744,320

(22) Filed: Dec. 22, 2003

(65) Prior Publication Data

US 2004/0218429 A1 Nov. 4, 2004

(30) Foreign Application Priority Data

Apr. 29, 2003 (KR) ................................ 10-2003-0026941

(51) Int. Cl.[7] ................................................ G11C 7/00
(52) U.S. Cl. ........................ 365/194; 365/233; 365/239
(58) Field of Search ................................ 365/194, 233, 365/239

(56) References Cited

U.S. PATENT DOCUMENTS 5,970,014 A * 10/1999 Kai et al. ................... 365/194

FOREIGN PATENT DOCUMENTS

JP        11-176158        7/1999

* cited by examiner

*Primary Examiner*—Huan Hoang
(74) *Attorney, Agent, or Firm*—Blakely, Sokoloff, Taylor & Zafman

(57) ABSTRACT

A data output control apparatus and method of a semiconductor memory device exactly synchronize the first read data with a clock signal by solving a problem that the first read data is faster than the clock signal as much as a transit time from a voltage level Vddq/2 to a power voltage Vddq or a ground voltage Vssq. For the purpose, the apparatus for sequentially outputting a plurality of read data stored in the semiconductor memory device includes a first path through which a first read data output control signal for controlling the output of the first read data among the plurality of read data is passing, and a second path through which a second data output control signal for controlling the output of the other read data following the first read data among the plurality of read data is passing, wherein the first read data output control signal is delayed as much as the transit time and outputted through the first path in response to a preamble time control signal for reporting the start of a data read operation.

8 Claims, 5 Drawing Sheets

APPARATUS AND METHOD FOR CONTROLLING DATA OUTPUT OF A SEMICONDUCTOR MEMORY DEVICE

FIELD OF THE INVENTION

The present invention relates to a semiconductor memory device; and, more particularly, to an apparatus and method for exactly synchronizing data output with rising/falling edges of a clock signal during a data read operation.

BACKGROUND OF THE INVENTION

In general, in a double data rate synchronous dynamic random access memory (DDR SDRAM), rising and falling edges of a clock signal are used when reading data out of cells or writing data in cells.

However, when reading data out of cells, there occurs discrepancy between the first one of read data and a data strobe signal.

Referring to FIG. 1, there is provided a block diagram showing the conventional read data control.

In FIG. 1, a pipe latch unit 110 is a device for storing and maintaining data during the column address strobe(CAS) latency (CL) when data of global input/output (I/O) lines GIO<0, 1, . . . , N> are transferred to a data output driver unit 160. The CL means an interval between a first rising edge of an introduction clock and that of a data strobe signal and the data strobe signal is enabled so as to capture data. In case of a DDR SDRAM, each pipe latch employs an even latch and an odd latch.

A pipe in counter 120 sequentially generates pipe latch input control signals pin<0, 1, . . . , M>, which are used to make the data of the global I/O lines GIO<0, 1, . . . , N> sequentially inputted into the pipe latch unit 110.

An even pipe output counter 130 sequentially produces pipe latch rising output control signals rpout<0, 1, . . . , M>, which are used to transfer the data stored in the even latch sequentially into the data output driver unit 160 after the CL based on a DLL rising clock rclk_dll.

An odd pipe output counter 140 sequentially generates pipe latch falling output control signals fpout<0, 1, . . . , M>, which are used to transmit the data stored in the odd latch sequentially into the data output driver unit 160 after the CL based on a DLL falling clock fclk_dll.

A rising/falling(r/f)_divider 150 generates data control signals, which are used to alternately input the data from the even latch and the data from the odd latch to the data output driver unit 160 in response to the DLL rising clock rclk_dll and the DLL falling clock fclk_dll.

The data output driver unit 160 supplies the data provided from the pipe latch unit 110 to output pins.

A data strobe generator and driver unit 170 generates a data strobe signal QS, which is used to output read data at an edge of the data strobe signal QS when reading out data and to capture write data when writing data.

In drawings, the clock is a signal transferred through an external clock pin and used inside of a memory device. A preamble time control signal qsen_pre is a control signal used to report the start of a read operation by maintaining the data strobe signal at a low level during one clock before the first read data being outputted in the read operation. The DLL rising clock rclk_dll is a clock pulse, which is generated in a delay locked loop when an external clock is at a rising edge, and the DLL falling clock fclk_dll is a clock pulse, which is produced in the delay locked loop when the external clock is at a falling edge. A rising out enable signal routen and a falling out enable signal fouten are signals, which enable or disable the DLL rising clock and the DLL falling clock, respectively. Rising edge output control signals rclk_do_u and rclk_do_l are control signals for turning-on the data output driver unit 160 to thereby synchronize the read data with a rising edge of the external clock and output the read data. Falling edge output control signals fclk_do_u and fclk_do_l are control signals for turning-on the data output driver unit 160 to thereby synchronize the read data with a falling edge of the external clock and output the read data. Herein, "u" and "l" at the rising(falling) edge output control signals r(f)clk_do_u and r(f)clk_do_l are used to distinguish an upper part and a lower part of the data output driver unit 160 and to control the two parts separately.

For instance, if there are 16 numbers of sub output drivers in the data output driver unit 160, the control signals r(f)clk_do_u are fed to sub output drivers 0 to 7 and the control signals r(f)clk_do_l are coupled to sub output drivers 8 to 15.

Data DQ<0~N> stored at memory cells are outputted through the data output driver unit 160 during the read operation. The data strobe signals outputted from the data strobe generator and driver unit 170 are of reporting the start of the read operation.

FIG. 3 depicts a detailed circuit diagram of the rising/falling(r/f)_divider 150 shown in FIG. 1.

The conventional r/f_divider 150 generates the rising edge output control signals rclk_do_u and rclk_do_l by logically combining the rising out enable signal routen and the DLL rising clock rclk_dll and produces the falling edge output control signals fclk_do_u and fclk_do_l by logically combining the falling out enable signal fouten and the DLL falling clock fclk_dll.

FIG. 5 is a timing diagram showing the conventional read data control.

According to the structure of FIGS. 1 and 3, in the data reading operation, the data DQ<0–N> and the data strobe signal QS(LQS/UQS) are controlled by one clock signal. However, while the first read data is transited from an output reference voltage Vddq/2, data from the second read data following the first read data are transited from a power voltage Vddq or a ground voltage Vssq. That is, a transit starting level of the first read data is different from those of the other read data. Since the first read data is always discrepant with the clock signal as much as a time that the first read data is transited from the output reference voltage Vddq/2 to the power voltage Vddq or the ground voltage Vssq, the first read data DQ(0) is outputted prior to the data strobe signal QS(LQS/UQS), so that it is impossible to perform the exact synchronization.

SUMMARY OF THE INVENTION

It is, therefore, an object of the present invention to provide an apparatus and method for exactly synchronizing the first read data with a clock signal by solving a problem that the first read data is faster than the clock signal as much as a transit time from a voltage level Vddq/2 to a power voltage Vddq or a ground voltage Vssq.

In accordance with an aspect of the present invention, there is provided an apparatus for sequentially outputting a plurality of read data stored in a semiconductor memory device, comprising: a first path through which a first read data output control signal for controlling the output of the first read data among the plurality of read data is passing; and a second path through which a second data output control signal for controlling the output of the other read data following the first read data among the plurality of read data is passing, wherein the first read data output control signal is delayed as much as a certain time and outputted through the first path in response to a preamble time control signal for reporting the start of a data read operation.

In accordance with another aspect of the present invention, there is provided a method for sequentially outputting a plurality of read data stored in a semiconductor memory device, comprising the steps of delaying a first read data output control signal for controlling the output of the first read data among the plurality of read data as much as a certain time and outputting a delayed first read data output control signal through a first path; and outputting a second read data output control signal for controlling the output of the other read data following the first read data among the plurality of read data through a second path distinguished from the first path.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

Hereinafter, a preferred embodiment of the present invention will be described in detail with reference to the accompanying drawings.

Figure 2:
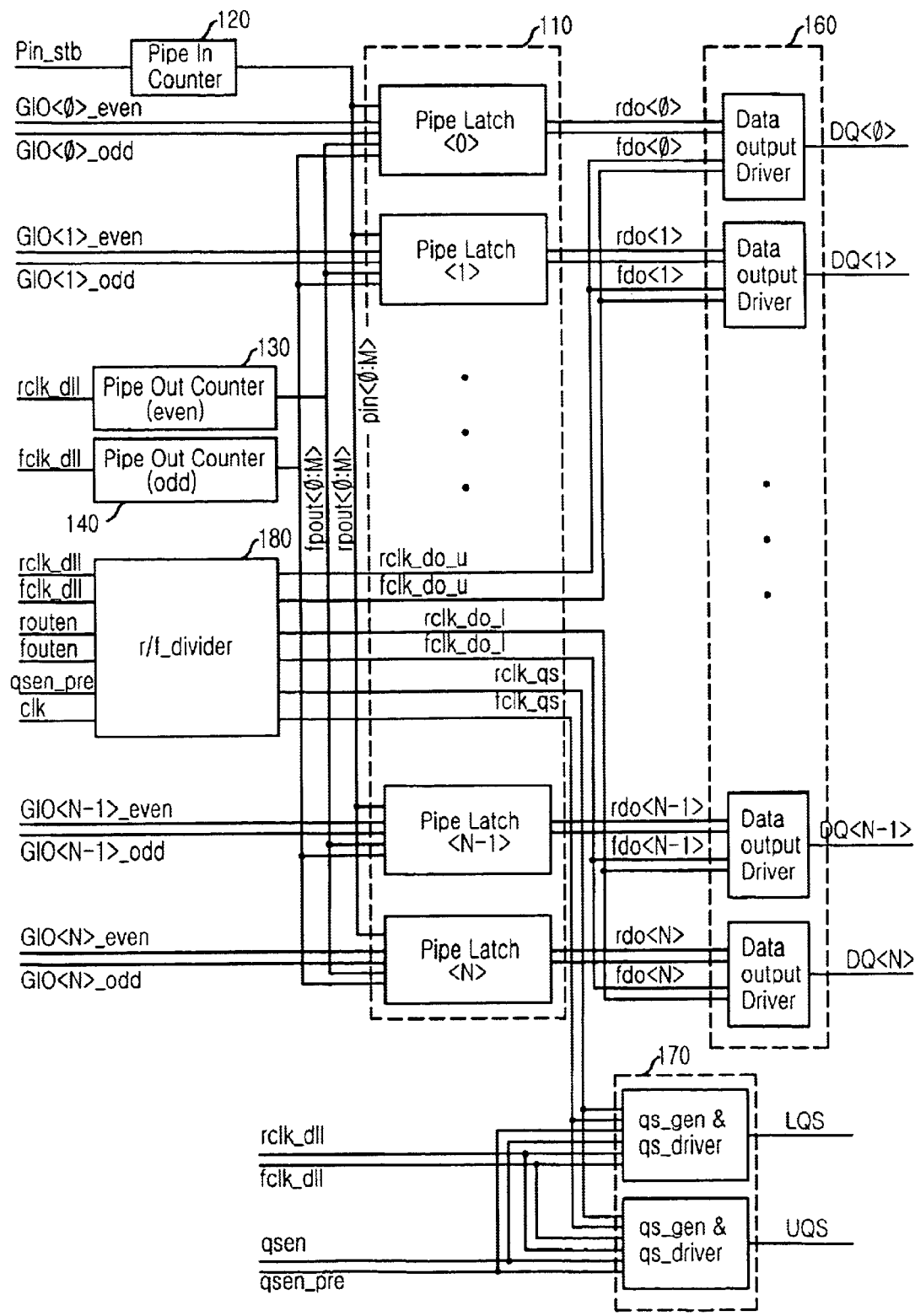
FIG. 2 provides a block diagram showing the read data control in accordance with the present invention.
Figure 3:
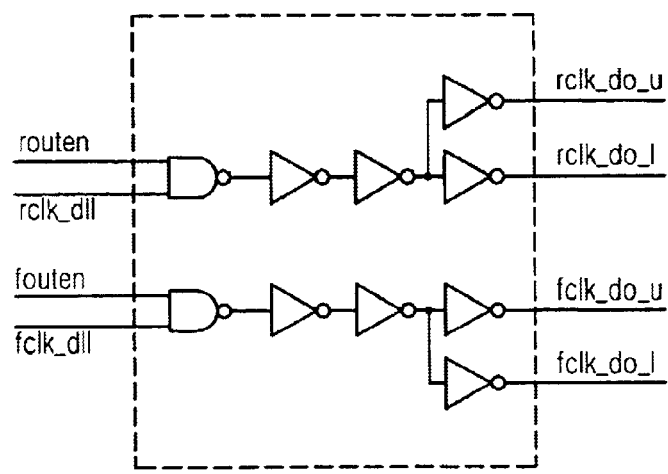
FIG. 3 depicts a detailed circuit diagram of a rising/falling divider shown in FIG. 1.

FIG. 2 provides a block diagram showing the read data control in accordance with the present invention.

Figure 1:
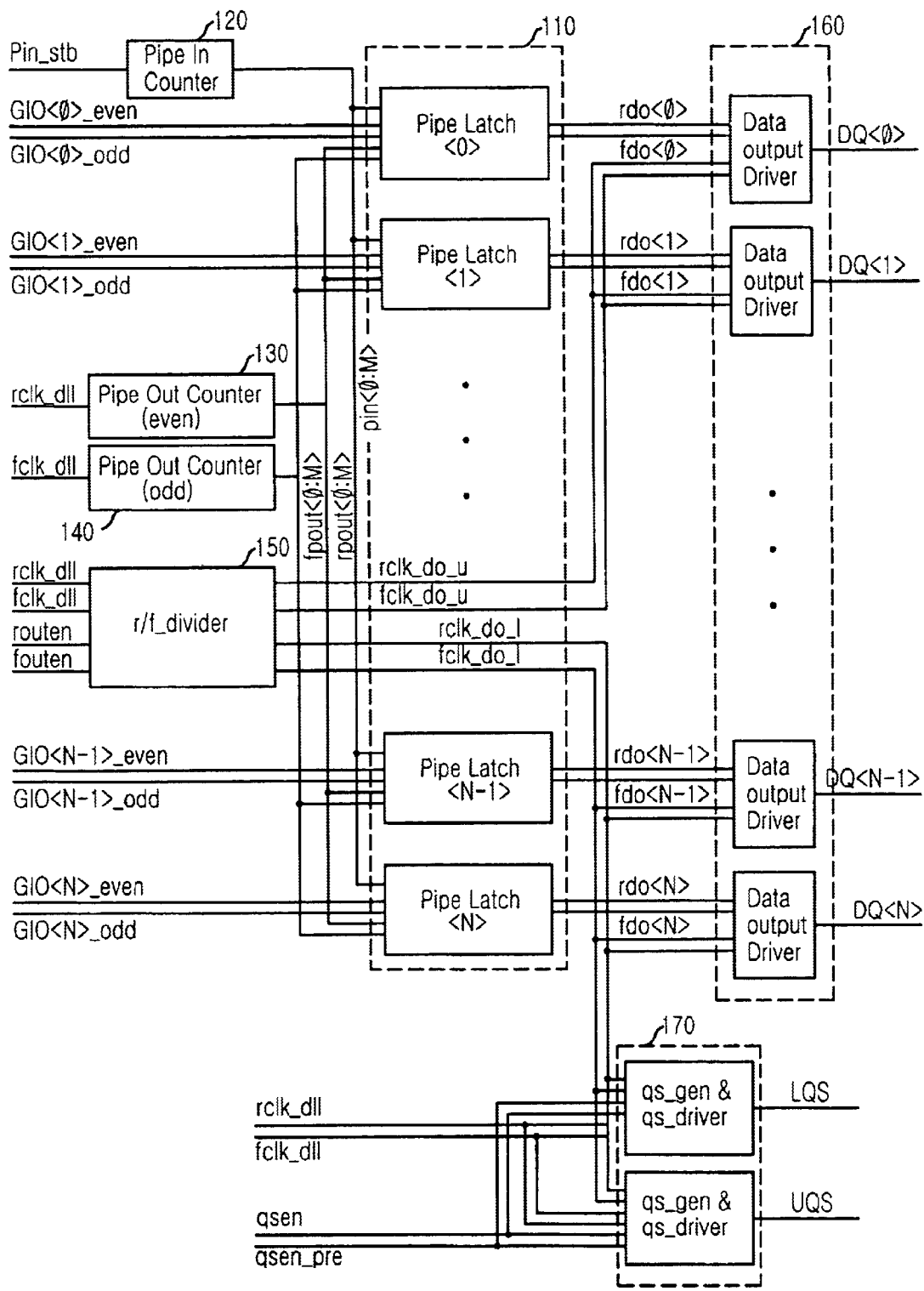
FIG. 1 is a block diagram showing the conventional read data control.

A structure of FIG. 2 is almost same to that of FIG. 1.

A rising/falling(r/f)_divider 180 delays only a data output control signal, which controls an output of the first read data by additionally using a preamble time control signal qsen_pre and an external clock clk.

A data strobe output control signal and data output control signals r(f)clk_do_u and r(f)clk_do_l for controlling the read data output are separately generated to have independent delay times, respectively.

The preamble time control signal reporting the start of the read operation is used to separate a path of a data output control signal for controlling the output of the first read data among a sequential plurality of read data and a path of a data output control signal for controlling the output of the other remaining read data. At this time, it is possible to exactly synchronize the read data with rising edge/falling edge of the clock by only delaying the first read data output control signal for a certain time. The certain time is a time required in transiting data from the Vddq/2 level to the power voltage level or the ground voltage level. Meanwhile, the data strobe generator and driver unit 170 has a difference in using a data strobe rising output control signal rclk_qs and a data strobe falling output control signal fclk_qs instead of using the rising edge output control signal rclk_do_l and the falling edge output control signal fclk_do_l outputted from the r/f_divider 150 of FIG. 1.

Figure 4:
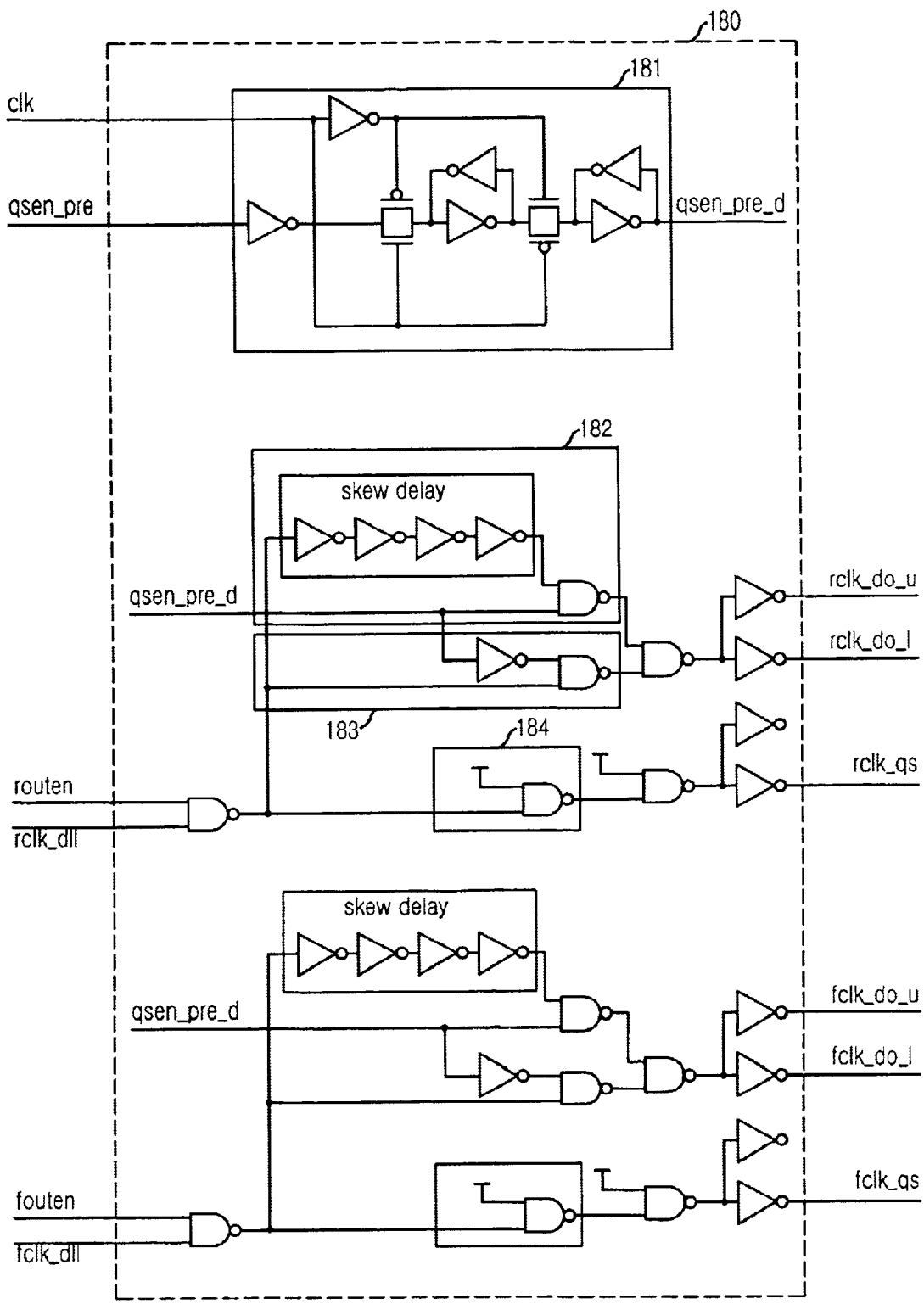
FIG. 4 represents a detailed circuit diagram of a rising/falling divider shown in FIG. 2.
Figure 5:
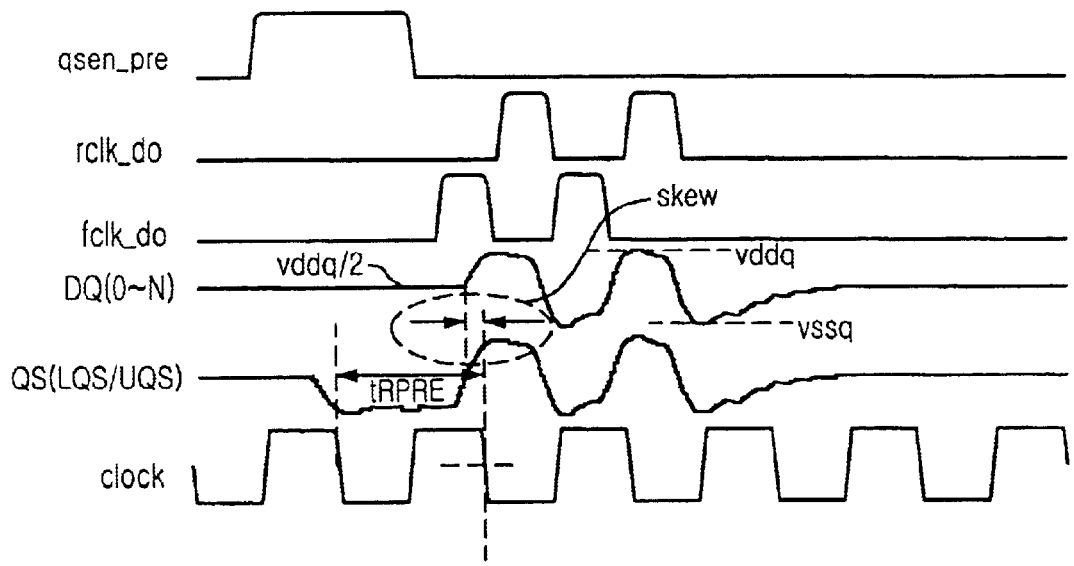
FIG. 5 is a timing diagram showing the conventional read data control.

FIG. 4 represents a detailed circuit diagram of the rising/falling divider 180 shown in FIG. 2.

The rising/falling divider 180 includes a half clock delay unit 181 for shifting the preamble time control signal qsen_pre as much as a half clock and outputting a delayed preamble time control signal qsen_pre_d by using the external clock clk, a first data output control signal generating unit 182 for delaying the data output control signal of the first read data as much as a certain time by using the delayed preamble time control signal qsen_pre_d, wherein the certain time represents a time required in transiting the data from the Vddq/2 level to the power voltage level or the ground voltage level, a second data output control signal generating unit 183 for passing data output control signals of the other remaining read data without delay, and a data strobe output control signal generating unit 184 consisting of a second input NAND gate whose delay time is identical to the delay time at the data output control signal generating units 182 and 183. The first data output control signal generating unit 182, the second data output control signal generating unit 183 and the data strobe output control signal generating unit 184 used in producing the rising edge output control signals rclk_do_u(l) can be also applicable to the generation of the falling edge output control signals.

That is, in the conventional device, the rising edge output control signals rclk_do_u/rclk_do_l and the falling edge output control signals fclk_do_u/fclk_do_l are commonly used in controlling data and a data strobe signal. However, in accordance with the present invention, they are only used in the data control, and the data strobe rising clock rclk_qs and the data strobe falling clock fclk_qs are used for controlling the data strobe signal.

Hereinafter, the operation of the apparatus described in FIGS. 2 and 4 is explained.

It is assumed that data of a "H" state and that of a "L" state are stored at the even latch and the odd latch, respectively, in each pipe latch of the pipe latch unit 110, i.e., Pipe Latch <0, 1, . . . , M> according to the operation of the pipe in counter 120. Meanwhile, since the data <0;N> are processed in parallel, the data <0> and the data strobe signals QS(LQS/UQS) are only described as an example so as to explain the data read operation.

Firstly, at one clock before the first read data is outputted, the data strobe signal QS is transited to a "L" state as being synchronized with an edge of the external clock by the data strobe generator and driver 170 in order to report the data read operation.

Secondly, if the pipe latch rising output control signal rpout<0> is activated to a "H" state, the data of the "H" state stored at the even latch of the Pipe Latch<0> is coupled to a data line rdo<0>. Then, when the rising edge output control signal rclk_do_u outputted from the rising/falling divider 180 is actuated, the data on the data line rdo<0> is outputted to a data pin DQ<0> through the data output driver 160 by being synchronized with an edge of the external clock and, simultaneously, the data strobe signal QS is transited from the "L" state to the "H" state by being synchronized with an edge of the external clock through a data strobe pin.

Thirdly, if the pipe latch falling output control signal fpout<0> is actuated to a "H" state, the data of the "L" state stored at the odd latch of the Pipe Latch<0> is coupled to a data line fdo<0>. Then, when the falling edge output control signal fclk_do_u outputted from the rising/falling divider 180 is activated, the data on the data line fdo<0> is outputted to the data pin DQ<0> through the data output driver 160 by being synchronized with an edge of the external clock and, at the same time, the data strobe signal QS is transited from the "H" state to the "L" state by being synchronized with an edge of the external clock through the data strobe pin.

Fourthly, if the pipe latch rising output control signal rpout<1> is activated to a "H" state, the data of the "H" state stored at the even latch of the Pipe Latch<1> is fed to the data line rdo<1>. Then, when the rising edge output control signal rclk_do_u outputted from the rising/falling divider 180 is actuated, the data on the data line rdo<1> is outputted to the data pin DQ<1> through the data output driver 160 by being synchronized with an edge of the external clock and, simultaneously, the data strobe signal QS is transited from the "L" state to the "H" state by being synchronized with an edge of the external clock through the data strobe pin.

Fifthly, if the pipe latch falling output control signal fpout<1> is actuated to a "H" state, the data of the "L" state stored at the odd latch of the Pipe Latch<1> is fed to the data line fdo<1>. Then, when the falling edge output control signal fclk_do_u outputted from the rising/falling divider 180 is activated, the data on the data line fdo<1> is outputted to the data pin DQ<1> through the data output driver 160 by being synchronized with an edge of the external clock and, at the same time, the data strobe signal QS is transited from the "H" state to the "L" state by being synchronized with an edge of the external clock through the data strobe pin.

As described above, the data stored at the Pipe Latch<0, 1, . . . , N> are provided to the data output driver 160 in response to the pipe latch rising output control signals rpout<0, 1, . . . , M> and the pipe latch falling output control signals fpout<0, 1, . . . , M>. Then, the data delivered to the data output driver 160 are outputted to the data pins DQ<0, 1, . . . , N> by being synchronized with the edge of the external clock in response to the rising(falling) edge output control signal r(f)clk_do_u outputted from the rising/falling divider 180.

Further, the data strobe signal is also outputted by being synchronized with the edge of the external clock through the data strobe pin.

Figure 6:
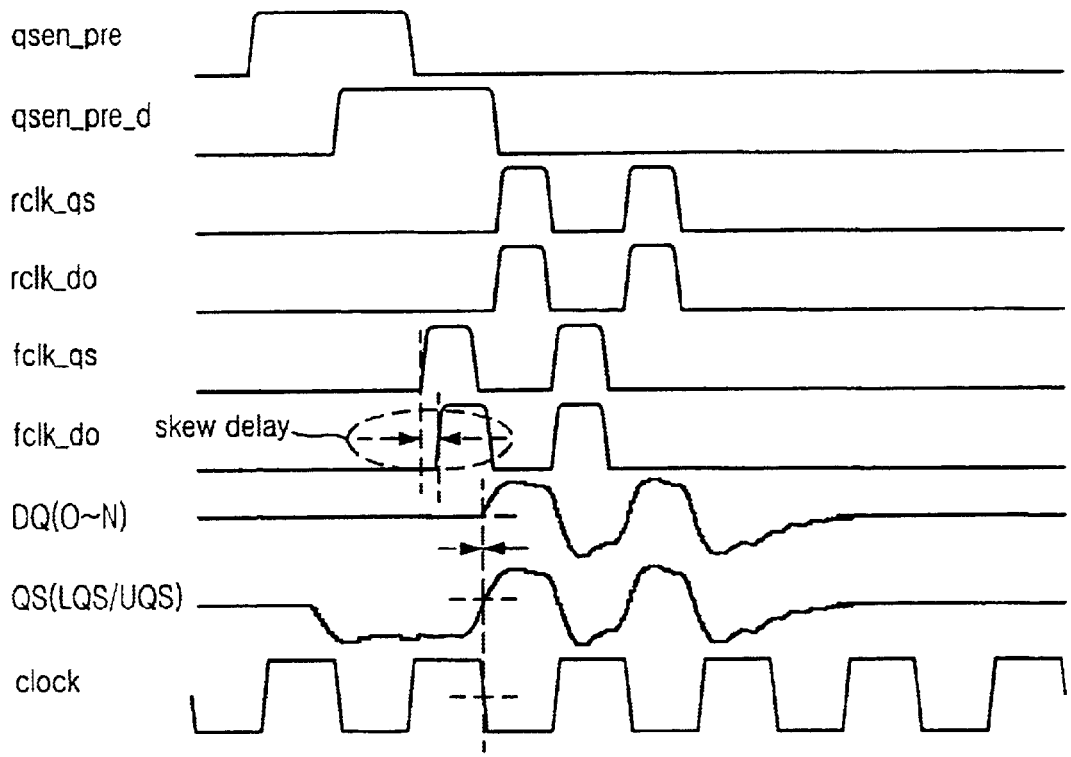
FIG. 6 is a timing diagram showing the read data control in accordance with the present invention.

FIG. 6 depicts a timing diagram showing the read data control in accordance with the present invention. It shows that the first read data DQ<0> and the data strobe signal QS(LQS/UQS) are outputted simultaneously.

In accordance with the present invention, by separating the first read data output control signal and the other following read data output control signals and delaying only the first read data output control signal as much as a certain time, it becomes possible to exactly synchronize the read data with a rising and falling edge of a clock. As the exact synchronization between the clock and the read data is accomplished, output margins among the read data are easily obtained and, thereafter, a semiconductor memory device operates in a high-speed.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. An apparatus for sequentially outputting a plurality of read data stored in a semiconductor memory device, comprising:
    a first path through which a first read data output control signal for controlling the output of the first read data among the plurality of read data is passing;
    a second path through which a second data output control signal for controlling the output of the other read data following the first read data among the plurality of read data is passing, wherein the first read data output control signal is delayed as much as a certain time and outputted through the first path in response to a preamble time control signal for reporting the start of a data read operation; and
    a half clock delay means for shifting the preamble time control signal as much as a half clock by using an external clock and outputting a delayed preamble time control signal.

2. The apparatus as recited in claim 1, further comprising:
    a first data output control signal generating means for delaying the first read data output control signal as much as the certain time by using the delayed preamble time control signal;
    a second data output control signal generating means for passing the second data output control signal without delay; and
    a data strobe output control signal generating means for delaying a clock from an enabled delay fixed loop as much as a delay time which is identical to a delay time at the second data output control signal generating means.

3. The apparatus as recited in claim 2, wherein the delay time is a time required in transiting data from a (½)*(power voltage level) to a ground voltage level.

4. The apparatus as recited in claim 3, wherein the half clock delay means includes:
    a first inverter for inverting the preamble time control signal;
    a second inverter for inverting the external clock;
    a first transmission gate for transferring an output of the first inverter in response to an output of the second inverter;
    a first latch consisting of a third and a fourth inverter inversely connected in parallel, for latching an output of the first transmission gate;
    a second transmission gate for transferring an output of the third inverter under the control of the output of the second inverter; and
    a second latch consisting of a fifth and a sixth inverter inversely connected in parallel, for latching an output of the second transmission gate.

5. The apparatus as recited in claim 3, wherein the first data output control signal generating means includes:
    a first to fourth inverter connected in series, for receiving the clock from the enabled delay fixed loop; and
    a NAND gate for receiving the delayed preamble time control signal and an output of said fourth inverter.

6. The apparatus as recited in claim 3, wherein the second data output control signal generating means includes:
    an inverter for inverting the delayed preamble time control signal; and
    a NAND gate for receiving an output of said inverter and the clock from the enabled delay fixed loop.

7. The apparatus as recited in claim 3, wherein the data strobe output control signal generating means includes a NAND gate for receiving the clock from the enabled delay fixed loop and the power voltage.

8. A method for sequentially outputting a plurality of read data stored in a semiconductor memory device, comprising the steps of:
   (a) delaying a first read data output control signal for controlling the output of the first read data among the plurality of read data as much as a predetermined time and outputting a delayed first read data output control signal through a first path; and
   (b) outputting a second read data output control signal for controlling the output of the other read data following the first read data among the plurality of read data through a second path distinguished from the first path,
   wherein the predetermined time is a time required in transiting data from a (½)*(power voltage level) to a ground voltage level.

* * * * *